United States Patent [19]

Ju et al.

[11] Patent Number: 5,736,724
[45] Date of Patent: Apr. 7, 1998

[54] OBLIQUE ACCESS TO IMAGE DATA FOR READING DATAFORMS

[75] Inventors: Paul P. Ju; Ynjiun P. Wang, both of Fort Myers, Fla.

[73] Assignee: Metanetics Corporation, Fort Myers, Fla.

[21] Appl. No.: 438,889

[22] Filed: May 10, 1995

Related U.S. Application Data

[63] Continuation-in-part of Ser. No. 258,428, Jun. 10, 1994, abandoned.

[51] Int. Cl.$^6$ .................................................. G06K 7/10
[52] U.S. Cl. ........................... 235/462; 235/436; 235/463
[58] Field of Search .......................... 235/462, 436, 235/439, 454, 472, 467, 463

[56] References Cited

U.S. PATENT DOCUMENTS

| | | | |
|---|---|---|---|
| 5,262,871 | 11/1993 | Wilder et al. | 358/213.11 |
| 5,276,400 | 1/1994 | Denyer et al. | 324/158 R |
| 5,304,787 | 4/1994 | Wang | 235/462 |
| 5,319,181 | 6/1994 | Shellhammer et al. | 235/462 |
| 5,396,054 | 3/1995 | Krichever et al. | 235/462 |
| 5,428,211 | 6/1995 | Zheng et al. | 235/462 |
| 5,473,148 | 12/1995 | Tawaka et al. | 235/462 |
| 5,489,769 | 2/1996 | Kubo | 235/462 |
| 5,500,516 | 3/1996 | Durbin | 235/462 X |
| 5,521,368 | 5/1996 | Adachi | 235/462 |
| 5,523,552 | 6/1996 | Shellhammer et al. | 235/462 |

FOREIGN PATENT DOCUMENTS

| | | |
|---|---|---|
| 0 260 954 | 3/1988 | European Pat. Off. |
| 2044 996 A | 10/1980 | United Kingdom |
| WO91/04633 | 4/1991 | WIPO |

*Primary Examiner*—Donald T. Hajec
*Assistant Examiner*—Le Thien Minh
*Attorney, Agent, or Firm*—Kenneth P. Robinson

[57] ABSTRACT

An image sensor array system is arranged to enable oblique access for readout of image data from a stepped pixel pattern of sensor cells. The stepped pixel pattern represents an oblique line component of an image portion containing a 2-D bar code or other dataform. An obliquely aligned bar code image can thus be read out along oblique lines which follow rows of bar code elements traversing the elements. The sensor array (16) is accessed by horizontal and vertical readout circuits (22 and 24) under the control of address signals from an address unit (20). Location signals, from a source (12), indicative of a selected image portion (39) may be used by the address unit (20) to provide address signals representative of the stepped pixel pattern for a particular oblique line component. Under the control of the address signals, image data from cells at the intersection of array lines and columns are sampled by sampling devices (26–32) and provided as output signals representative of the selected oblique line component. The output signals are then usable for decoding the bar code or other dataform.

26 Claims, 7 Drawing Sheets

| CARTESIAN COORINATE | CORRESPONDING MEMORY ADDRESS |
|---|---|
| $X_1$  $Y_1$ | 1 |
| $X_2$  $Y_1$ | 2 |
| $X_3$  $Y_1$ | 3 |
| $X_4$  $Y_1$ | 4 |
| $X_5$  $Y_1$ | 5 |
| $X_6$  $Y_1$ | 6 |
| $X_7$  $Y_1$ | 7 |
| $X_8$  $Y_1$ | 8 |
| $X_1$  $Y_2$ | 9 |
| $X_2$  $Y_2$ | 10 |
| $X_3$  $Y_2$ | 11 |
| $X_4$  $Y_2$ | 12 |
| $X_5$  $Y_2$ | 13 |
| $X_6$  $Y_2$ | 14 |
| $X_7$  $Y_2$ | 15 |
| $X_8$  $Y_2$ | 16 |
| $X_1$  $Y_3$ | 17 |
| $X_7$  $Y_5$ | 39 |
| $X_8$  $Y_5$ | 40 |

OBLIQUE ACCESS TO IMAGE DATA FOR READING DATAFORMS

This application is a CIP of Ser. No. 08/258,428 filed on Jun. 10, 1994 now abandoned.

This invention relates to image sensor array systems for reading dataforms and, more specifically, to systems enabling oblique access to image data for efficient reading and decoding of obliquely oriented dataform images.

BACKGROUND OF THE INVENTION

Images are commonly sensed in two-dimensional arrays of sensor cells utilizing photodiodes. In order to access image data (developed by conversion of incident radiation to charge or potential temporarily stored in individual sensor cells, for example) the entire array of sensors is typically scanned on a sequential line-by-line basis under the control of shift registers or other control circuitry.

While such arrangements may be suitable for sensing and reading out entire images, they are less efficient in accessing only a selected portion of an image. A disadvantage in speed of operation results from the need to read out an entire 1 to N lines of image data in order to provide access to selected image data which may exist at the Nth line. Thus, for example, for an image sensed by a 128×128 sensor array, access to a selected portion of image data, such as line 120, a particular pixel in line 120, or lines 120-128, will require that image data at lines 1-119 first be read out and discarded. While the actual time required to read out such 119 lines of unwanted image data may be of short duration, the total wasted time may be significant in repetitive operation of a high-speed system. Alternatively, acceptable operating time may be achievable, but may necessitate the higher cost of very high speed circuits (e.g., high capability integrated circuits).

The automated reading of bar codes and matrix codes provides one example of an operative need for access to image data for only a portion of an image. An automated system may scan an image area which includes a two-dimensional bar code, for example. The location of the bar code within the image area can then be determined as described in U.S. Pat. No. 5,304,787, entitled "LOCATING 2-D BAR CODES", issued Apr. 19, 1994, the content of which is hereby incorporated by reference. With information as to the actual location of the bar code within the image area, it is then desirable to be able to access the limited area bar code image data without the necessity of reading out image data for the entire image area.

Even with information as to the location of a bar code, a bar code obliquely oriented in an image area would typically be read out on a horizontal line by line basis. As will be discussed, horizontal line (or vertical line) readout applied to lines of bar code elements which are obliquely oriented provides less than optimum readout efficiency.

Prior image sensing systems operating with line-by-line sequential readout of image data can be provided in a variety of embodiments. For example, an integrated circuit approach is described in international application number WO91/04633, published under the Patent Cooperation Treaty on Apr. 4, 1992, entitled "I.C. Sensor". This publication illustrates an integrated arrangement of a sensor array and charge sampling devices enabling readout of image data for an entire image, but not randomly accessed portions of the image.

A number of image data readout variations, including arrangements employing random addressing and superpixel readout for readout of different image areas at different resolutions to achieve increased frame rates, are described in U.S. Pat. No. 5,262,871, entitled "MULTIPLE RESOLUTION IMAGE SENSOR", issued Nov. 16, 1993. Also, U.S. Pat. No. 5,396,054, entitled "BAR CODE READER USING SCANNED MEMORY ARRAY", issued Mar. 7, 1995, addresses scanning a memory to determine the position, size and shape of a stored bar code image in order to define the angular displacement of rows of bar code elements. However, these references do not disclose effective arrangements for implementing oblique access to image data or the provision of address signals for efficient reading of oblique line components of image data.

Objects of the present invention are, therefore, to provide new and improved image sensor array systems, and such systems enabling access on an oblique line basis to more selected portions of image data sensed by an image sensor array.

An additional object is to enable reading of an obliquely oriented bar code along oblique lines transverse to individual bar elements of the bar code.

SUMMARY OF THE INVENTION

In accordance with the invention, an oblique access system, enabling access to dataform image data via an oblique line component of an image portion containing an image of the dataform, includes a two-dimensional array of image sensor cells positioned in rows and columns and arranged to provide image data representative of an image area including the image portion containing the dataform image. An address unit is arranged to provide address signals effective to identify a stepped pixel pattern of sensor cells representative of the oblique line component, the oblique line component being positioned obliquely to the rows and columns of the array. The address signals are provided in a form usable to access image data originating from sensor cells comprising the stepped pixel pattern. A data access arrangement responsive to the address signals is arranged to make available for further use output signals representative of image data originating from sensor cells comprising the stepped pixel pattern. The output signals are representative of the oblique line component of the selected portion containing the dataform image.

The oblique access system as described thus provides the output signals as a one-dimensional sequence of image data values without related information to identify the two-dimensional oblique orientation of the oblique line component. As a result, the output signals effectively represent the oblique line component after rotation to a row or column alignment not oblique to the rows and columns of the array of image sensor cells.

An oblique access method for accessing image data representative of a dataform, includes the steps of:

(a) providing image data representative of rows and columns of pixels comprising an image area including an image portion containing an image of the dataform;

(b) providing address signals identifying a stepped pixel pattern representative of a first oblique line component of the image portion which is positioned obliquely to the rows and columns of pixels;

(c) utilizing the address signals to make available for further use output signals representative of image data for pixels included in the stepped pixel pattern and thereby representative of the first oblique line component of the selected image portion containing the dataform image; and (d) utilizing the output signals to decode the dataform.

For a better understanding of the invention, together with other and further objects, reference is made to the accompanying drawings and the scope of the invention will be pointed out in the accompanying claims.

DESCRIPTION OF THE INVENTION

Figure 1:
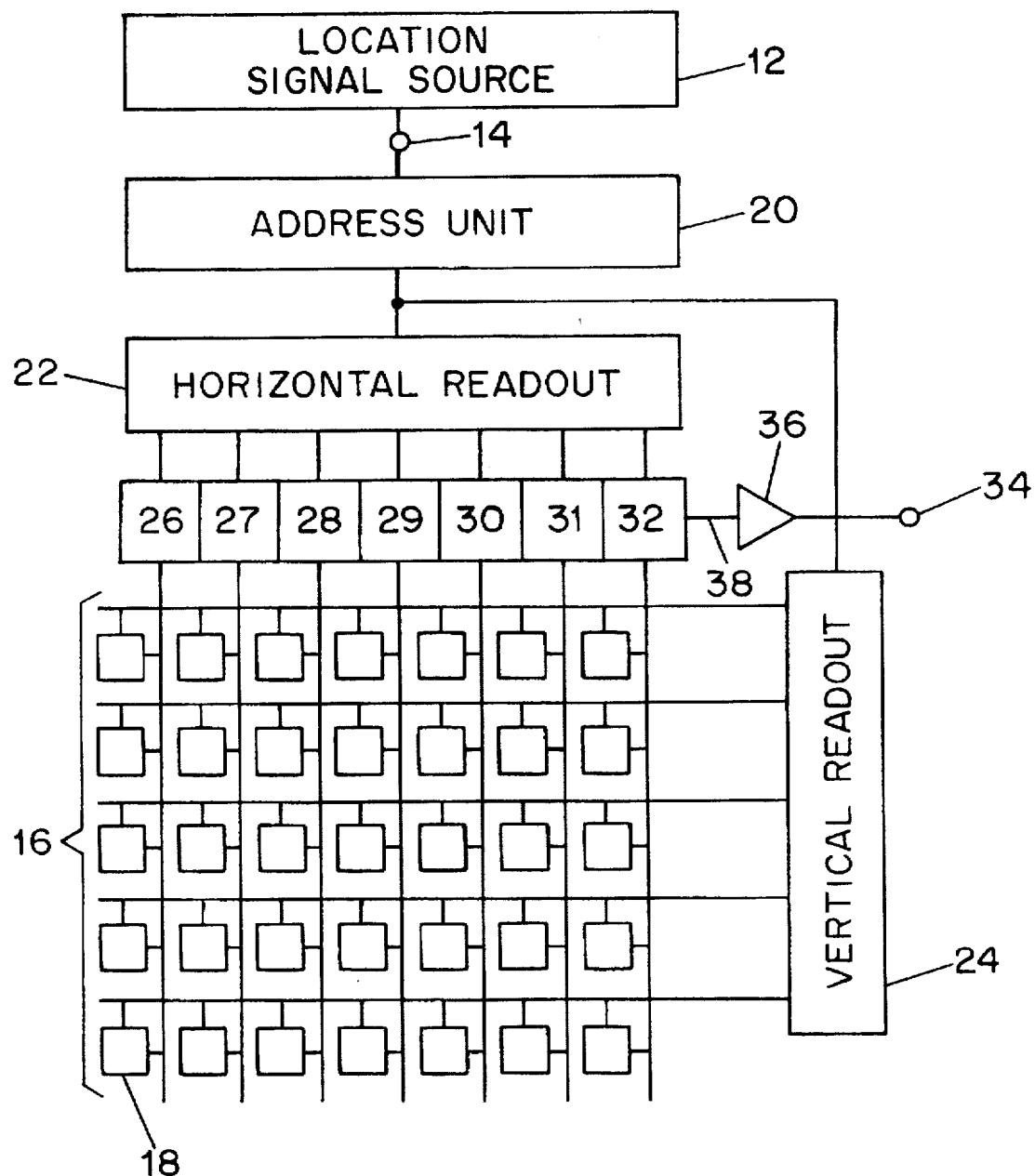
FIG. 1 illustrates a form of addressable access image sensor array system in accordance with the invention.
Figure 2:
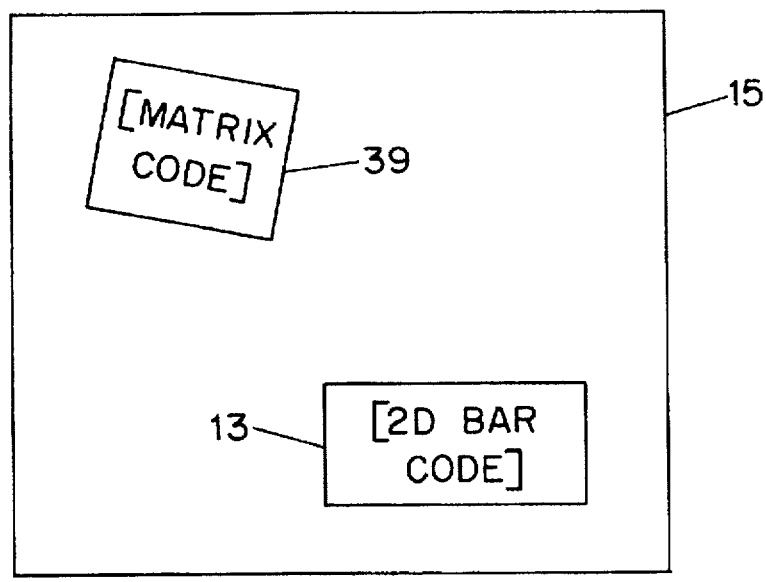
FIG. 2 is a representation of bar code and matrix code images within a larger image area, which is useful in describing operation of the FIG. 1 system.

An embodiment of an addressable access image sensor array system 10 is illustrated in FIG. 1. An oblique access system in accordance with the invention will be more particularly described with reference to FIG. 4. In FIG. 1, system 10 includes a coupling device, shown as location signal source 12, arranged to make available at coupling port 14 location signals representative of a selected portion of an image area. With reference to FIG. 2, in one example such location signals may represent the location of a two-dimensional bar code 13 within a larger image area 15. In different embodiments, the coupling device may be represented by location signal source 12 in the form of a system for bar code location, or merely by coupling port 14 to a device for making available signals provided from a source such as a bar code location system. The location signals can be provided in any appropriate form, e.g., signals representative of X and Y coordinates of the upper left corner and lower right corner of bar code 13 within area 15.

The FIG. 1 system also includes a two-dimensional array of image sensor cells, shown as array 16, arranged to sense image data representative of an image area, such as image area 15 including bar code image 13. Array 16 typically comprises a two-dimensional arrangement of individual photodiodes 18 which are electrically isolated and, when exposed to light or other radiation representative of a selected image, are effective to sense and make available image data in the form of varying levels of electronic charge or potential on a cell-by-cell (pixel-by-pixel) basis, or other suitable arrangement.

An address unit 20 is arranged to provide address signals representative of the location of the selected portion (e.g., bar code image 13) within the image area 15. In this embodiment, address unit 20 is coupled to input port 14 and is responsive to the location signals from unit 12, as shown. Thus, depending upon the particular form of the location signals (e.g., X and Y coordinates of corner locations), address unit 20 is configured to provide address signals for array cells which are expected to provide storage of image data representative of the bar code image, in this example. The particular configuration of unit 20 can be determined by skilled persons using available technology, in view of the particular form of the location information to be utilized, etc. Operation of address unit 20 will be described in greater detail with reference to the FIG. 4 embodiment of the invention. In particular embodiments, it may be desirable to provide address signals corresponding to a somewhat larger image portion than specifically indicated by the location signals, so as to ensure that the entire bar code image area is included.

The FIG. 1 system further includes horizontal and vertical readout circuits 22 and 24, respectively, coupled to address unit 20 and responsive to the address signals. Horizontal readout circuit 22 is arranged to selectively designate a column of cells of array 16 (e.g., the column most closely corresponding to the left hand edge of bar code image 13). Vertical readout circuit 24 is arranged to selectively designate a row of cells of the array 16 (e.g., the row most closely corresponding to the upper edge of bar code image 13).

Also included is a plurality of sampling devices, shown as sample and hold amplifiers 26–32. The sampling devices 26–32 are each arranged to access, sample and temporarily hold image data (e.g., as represented by a sensor cell charge) existing at the cell at the intersection of a selected row and a selected column, as designated by the address signals from address unit 20. Thus, by designating a row of cells corresponding to the top edge of bar code image 13 and sequentially designating columns of cells, image data representative of the uppermost part of bar code image 13 is accessed and read into the appropriate ones of sampling devices 26–32, in this example. Readout circuits 22 and 24 may be shift register type circuits arranged for sequential designation of one or more selected rows and columns using available techniques.

An output device, shown as output port 34, is arranged to provide output signals representative of the accessed image data (e.g., bar code image portion 13). As illustrated, the output circuit includes an amplifier 36 connected to a common readout line 38 which is arranged to receive image data signals from each of the sampling devices 26–32. The system is arranged so that as a selected row and a selected column are designated by readout circuits 24 and 22, the image data available in the cell at the intersection of such row and column is used as the basis for output signals provided at output port 34. In addition, after image data at one such cell is read out, any other cell in the array may be selected on a random or other predetermined basis to have its image data read out next. By repetition, image data for any desired area of the image area can be read out and stored for further processing without requiring the time and memory which would be needed if data for the entire image were read out.

Figure 3:
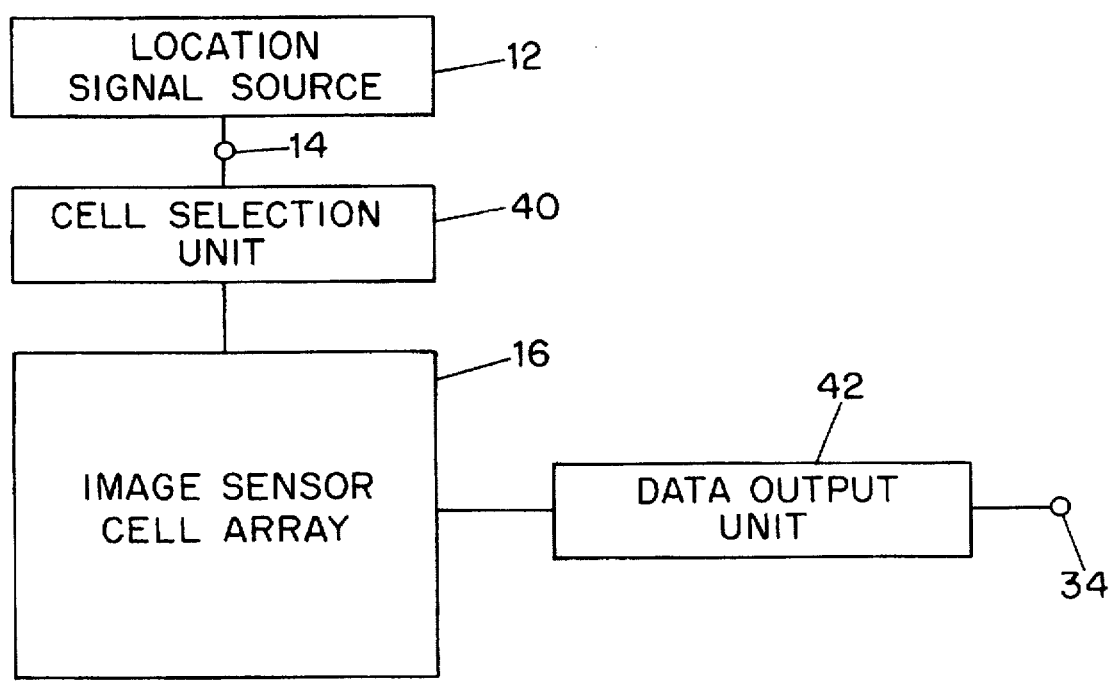
FIG. 3 illustrates a first alternative embodiment of the invention.

Referring now to FIG. 3, there is illustrated a more general implementation of an addressable access image sensor array system in accordance with the invention. In FIG. 3, location signal source 12 is connected, via coupling port 14, to cell selection unit 40 which is arranged for designating at least one cell within a selected portion of an image area for which image data is available from image sensor cell array 16, as described above. In the FIG. 1 system, address unit 20 in cooperation with horizontal and vertical readout circuits 22 and 24 are arranged to selectively designate rows and columns of cells in order to access selected cells. In the FIG. 3 system, cell selection unit 40 is included to provide a cell designation function and may be implemented as in FIG. 1 or in other appropriate manner by skilled persons once having an understanding of the invention. The system of FIG. 3 further includes data output unit 42 arranged for providing a signal representative of the image data provided by a portion of the selected cells of array 16. Unit 42 may be implemented by skilled persons in the form of devices such as 26–32, 36 and 38 as described, or in other appropriate form in order to provide operation in accordance with the invention. As shown, unit 42 may be arranged to provide the desired image data at output terminal 34 or in other suitable manner.

In operation of the systems of FIGS. 1 and 3 a variety of modes of image data readout can be carried out, depending upon the particular location signals provided at input port 14. Thus, randomly addressable access enables selection of a portion of image data as small as that represented by a single cell or pixel of the image, as discussed above. Single cells at different image area locations, or small two-dimensional image areas (e.g., 6 by 6 cell areas) at different locations, can be selected on an image sampling basis in order to survey image content, before initiating readout of image data for a selected image portion. Alternatively, utilizing location signals representative of the corners of a bar code image portion of interest, all image data representative of the bar code can be read out, while ignoring other portions of the overall image area which are not of current interest. Also, if desired, location signals can be provided in a form calling for readout of the image data for the entire image area on a sequential cell-by-cell, line-by-line basis, as in prior systems. This flexibility of operation provides both adaptability to varying objectives, and time efficient readout of image data for selected image portions. In addition to time savings, where data is read out and stored in memory for processing (e.g., bar code decoding) the required memory capacity can be significantly reduced by storage only of the image data for the image portion of interest, rather than requiring the storage of image data for the entire image as in prior systems.

It should be noted that in operation of systems in accordance with the invention, with particular reference to the FIG. 1 system for purposes of example, area selection is not limited to horizontally oriented rectangular areas as represented by bar code image 13 in FIG. 2, for example. The image area 15 illustrated in FIG. 2 also includes a matrix code image 39, shown tilted. With the provision of location signals representative of portion 39 of the image area 15 and the cell-by-cell addressable access capabilities of the invention, image data representative of the tilted square portion of the image area can be selected and read out by the system. Correspondingly, image portions such as circles, triangles, strips, irregular shapes, etc., can be selected (e.g., substantially any area), as well as lines and individual cells or pixels.

In particular implementations of the invention a trade-off between system complexity and performance may be appropriate. Thus, for example, with reference to FIG. 2, selecting only the portion of image area 15 actually occupied by bar code image 13, might represent time and memory savings of the order of 95 percent (i.e., if area 13 is equivalent to 5 percent of area 15). However, if the height of area 13 represents 20 percent of the height of area 15, 80 percent time and memory savings might be achievable by reading out each full row of the array which includes image data for the bar code, while not reading out the remaining rows. Accordingly, a system for carrying out this "full line" mode addressable operation, may include a horizontal readout circuit (24) responsive to the address signals to selectively designate a row of sensor cells and sampling devices (26–32) arranged to access data available at cells in the designated rows of cells. This full line approach can be implemented along either axis to read out either horizontal or vertical lines of image data, without providing the capability of selection along the other axis.

With reference to a tilted image such as 39, within larger image area 15, the addressable system can be configured to read out oblique lines as if they were horizontally or vertically oriented. Thus, a selected image portion 39, which includes an oblique line component (e.g., the upper edge), may be included in an image area 15 available in an array of sensor cells positioned in rows and columns. The address unit is arranged to provide address signals representative of the location within the image area 15 of the oblique line representing the top edge of selected portion 39. The readout circuit arrangement is responsive to the address signals to selectively designate a series of sensor cells at row and column intersections representative of the location of the oblique line component (e.g., an obliquely aligned line of cells). The sampling devices (26–32) access image data available at cells in said series of cells. The output device (34) then provides output signals from the series of cells (e.g., oblique line of cells) to provide output signals representative of the oblique top edge of image portion 39 rotated to an alignment not oblique to the rows and columns of the cells of array 16. This "rotation" can be accomplished inherently by reading out the image data from the obliquely aligned line of cells without providing any accompanying information as to the angular orientation (i.e., just reading out the image data sequentially and treating the data as representative of a horizontal line, for example). By repetitive action, data for additional oblique line portions can be read out to provide complete image data for image portion 39.

In particular implementations of the invention, location signals can be provided to coupling port 14 in a variety of formats. Such data can be provided by serial, parallel or combined formats or protocols. As noted, location signals can also call for a total image sequential readout in a traditional manner. Using random access logic, a user can call out varying levels of cell, line or area specificity. For example, if it is desired to read out all image data from lines 100 to line 150 of an array, the user can call for a readout beginning at line 100 and continuing on a line-by-line basis to line 150. Alternatively, the address line capabilities can be expanded to provide wider bus width to enable access to one particular sensor cell by control of readout circuits 22 and 24, rather than merely providing information at a line designation level. For example, for a 128×128 sensor cell array, a 7-bit wide address bus will enable random access of any line, a 14-bit wide address bus will enable random access to each single cell, and widths between 7 and 14 bits will enable access at levels between a cell and a line. Below 7-bit width, a 6-bit bus will permit access to any 2 adjacent lines, a 5-bit line will enable access to any 4 adjacent lines, etc. It will thus be appreciated that where, in a particular application, access is desired to single cells or to particular portions of image data, location signal, address signal and address bus specifications can be chosen to permit address bus and other capabilities to be provided on the most cost effective basis.

FIG. 4 Embodiment

In reading out image data from a sensor array (such as shown at 16 in FIG. 1) for further processing, it is commonly desirable to retain the two-dimensional values of the data. Thus, for example, if an image of a face is captured, it is desirable that image data be read out of an array in a manner retaining two-dimensional values effective to identify the location of each eye relative to the nose. In the prior art such two-dimensional values are typically retained by reading out image data from successive horizontal rows or vertical columns and keeping track of the order of the rows or columns to enable accurate reconstruction of the original image. Since each line is a horizontal or vertical image element, no angular information need be developed or retained.

In contrast, in reading many types of dataforms, such as bar codes, two-dimensional values per se are not important. The desired output is typically a one-dimensional sequence of data merely representing the widths and spacings of all the bar elements of the bar code in a one-dimensional stream. This is true for both one and two-dimensional bar codes, for example.

If a two-dimensional bar code is aligned in an image area with the bar elements aligned vertically, it is possible to develop decodable image data efficiently and effectively by reading out horizontal lines of image data. However, a dataform may commonly be obliquely oriented as shown in FIG. 2 in which box 39 represents a selected image area portion containing a data code or other dataform. For such an obliquely-positioned dataform the technique of reading out image data from horizontal lines of sensor cells, as in the prior art, does not achieve best operative efficiency. Thus, for example, consider a horizontal line readout of image data for matrix code 39 of FIG. 2. The first or top line readout may include only one pixel of relevant image data from a single sensor element at the upper corner of box 39. A horizontal line readout half way down, across the middle of box 39, would likely cut across more than one horizontal row of code elements. As a result, after the image data is read out the image of the matrix code must be actually or effectively reconstructed so that data for complete rows of code elements can be stitched together or otherwise processed to develop a one-dimensional sequence of element width data to permit decoding.

In accordance with the invention, more effective processing of image data is achieved by oblique access for readout of image data representative of bar codes and other dataforms. Thus, for example, with respect to the obliquely positioned dataform area 39 of FIG. 2, if a plurality of laterally spaced oblique line components are defined so as to lie along lines parallel to the top of area 39, image data will be read out from oblique lines of sensor cells extending nominally perpendicularly to the bars of a bar code image in box 39. This arrangement of oblique readout, with each oblique line component traversing all or at least a major portion of all of the individual bar code elements in a row of elements, enables much more efficient operation. In practice, the oblique line components chosen for a particular image may be laterally spaced from each other, diminishing the total amount of image data required. As a result, the image data as read out may represent directly decodable bar code data, almost as if the bar code elements had been vertically aligned and image data simply read out along horizontal lines.

The use of oblique line readout appropriate for readout of bar code data and other applications is described at length above in prior portions of this description with reference to FIG. 1 and tilted image area 39 of FIG. 2. Such operation as described above specifically refers to the providing of output signals from a series of sensor cells (e.g., oblique line of cells) to provide output signals representative of the oblique top edge of image portion 39 rotated to an alignment not oblique to the rows and columns of the cells of array 16. As there noted, this "rotation" can be accomplished by reading out the image data from the obliquely aligned line of cells without providing any accompanying information as to the angular orientation of the line. In this way, for example, image data for an oblique line transverse to the bars of an obliquely positioned bar code is read out via sampling devices 26-32 and output amplifier 36 sequentially, as if representative of image data from a horizontal line of sensor cells. The end result is thus that by this oblique line readout technique the output bar code image data has substantially the same form as if non-oblique bar code image data was obtained by prior art readout of horizontal lines of sensor cells (e.g., directly as a one-dimensional sequence of image data representative of the width and spacing of dataform elements). This result is contrasted to the prior art type representation of an obliquely oriented bar code by horizontal (or vertical) scan line portions, requiring reconstruction and analysis of the oblique bar code image to enable decoding.

Figures 4, 5A:
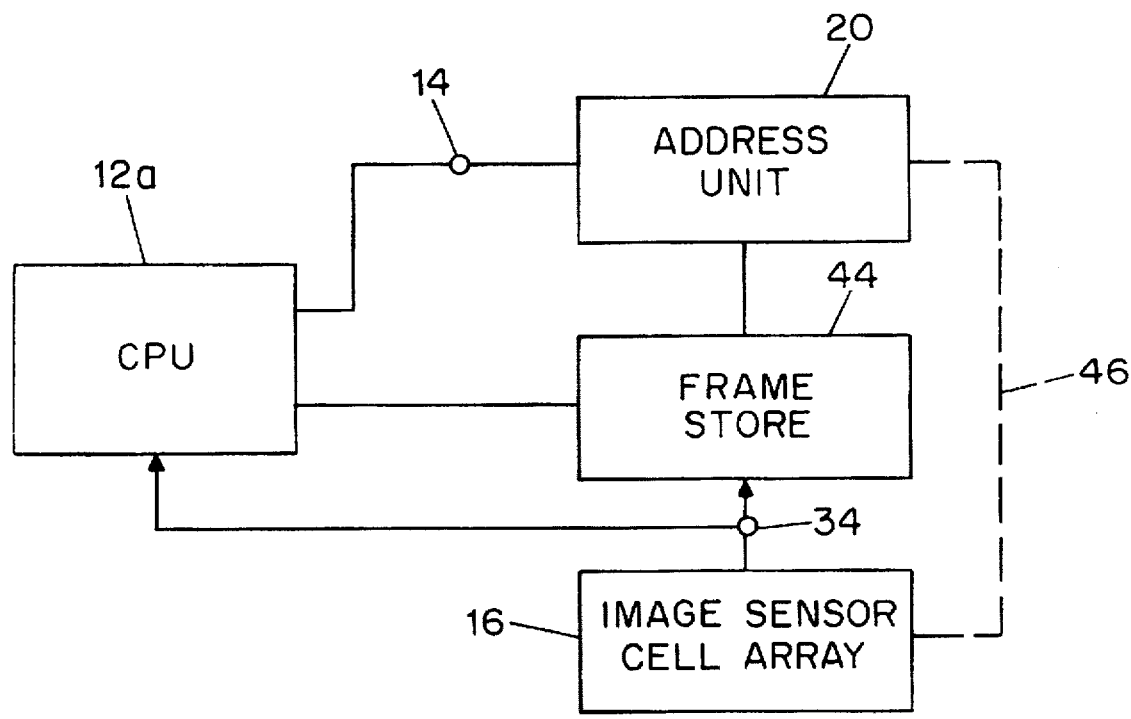
FIG. 4 illustrates a second alternative embodiment of the invention.
FIGS. 5A and 5B are graphical representations of coordinates and sequential numerical addresses of pixels of a two-dimensional array.

FIG. 4 illustrates an embodiment of the FIG. 1 system more particularly configured for use in reading bar codes, matrix codes and other forms of dataforms. For present purposes, a dataform is defined as a pattern of higher and lower reflectivity elements presented in an optically readable format, such as a bar code readable by reflected light. As shown in FIG. 4 a memory unit, illustrated as frame store 44, is provided for storing all (or one or more portions) of a complete frame of image data derived by reading and storing image data from image sensor cells of array 16. As illustrated, frame store 44 has been added between array 16 and address unit 20 of FIG. 1. Also, location signal source 12 of FIG. 1 is represented in FIG. 4 as central processing unit (CPU) 12(a), which is arranged to operate with a variety of types of software programming. Such software may include (a) programs suitable for locating bar codes, (b) run line programs for identifying start and stop points of an oblique line component, the start point and inclination angle or slope of an oblique line component, or combinations of points and slopes and (c) one or more programs for decoding bar codes or other types of dataforms from image data representative thereof.

Bar code location systems and methods as discussed with reference to U.S. Pat. No. 5,304,787 can thus be arranged to provide location signals for the four corners of a bar code located within an image stored in frame store 44 (e.g., the four corners of box 39 of FIG. 1), together with information as to the actual orientation of the bar code within its bounding box. It will be appreciated that in FIG. 1 the configuration of the oblique access image sensor array system is considered basically independently from the implementation and operation of the location signal source 12. That is to say, for example, in a possible configuration such as a high-speed conveyorized system for reading bar codes on packages, unit 12 of FIG. 1 could take the form of an independent bar code locating system having its own sensor array and frame store. Unit 12 would thus operate independently as a location signal source feeding bar code location data to address unit 20 of FIG. 1. In contrast, FIG.

4 illustrates an integrated system in which a single sensor array provides image signals usable by a bar code locator, as well as for oblique access functions of the system, as will be further described.

In FIG. 4, CPU 12a is arranged to provide signals identifying oblique line components along which image sensor cells are to be read. As noted, these signals may comprise data identifying the start and stop points of oblique lines, the slope of such oblique lines, or combinations of such points and slopes. For present purposes, "oblique" lines are defined as lines positioned obliquely to the rows and columns of sensor elements of an array. Address unit 20 is responsive to such data from CPU 12a to generate address signals sequentially addressing each pixel or sensor cell position defining the oblique line component as identified by CPU 12a. As will be described further with reference to FIG. 6, such address signals are effective to identify a stepped pixel pattern of sensor cells representative of the oblique line component. This capability of using stepped pixel patterns enables image data to be read out along oblique line components selected to extend along rows of elements of a dataform traversing the elements in a direction substantially perpendicular to the elements. By this oblique access along oblique lines of dataform elements, operative efficiencies include the ability to laterally space oblique sampling lines by a spacing greater than the pixel to pixel pitch transverse to such sampling lines, so that not all pixels need be read to enable dataform decoding. Also, the need for prior types of two-dimensional dataform image reconstruction, stitching of broken lines of elements, etc., can be avoided or significantly reduced.

The address signals from address unit 20 may be utilized in two different manners in the FIG. 4 system. The address signals may have the form of memory address signals usable to access stored image data originating from sensor cells comprising a stepped pixel pattern. Such signals are coupled from unit 20 to frame store 44 in order to sequentially address the memory location of the stored image data originating from sensor cells representing each pixel of the stepped pixel pattern for the desired oblique line component of the stored image. The image data from the selected memory locations is then provided to CPU 12a for further processing, which may include decoding of the bar code or preparation of bar code data for transmission to another location for decoding. Alternatively, utilizing the dashed connection 46 between address unit 20 and array 16, address signals may have the form of array address signals usable to identify row and column locations of sensor cells comprising the stepped pixel pattern. Such signals are coupled directly to the horizontal and vertical readout registers 22 and 24 of array 16, for example, for pixel by pixel readout of image data for a stepped pixel pattern representing the desired oblique line component of an image captured by the sensor cells of array 16. Thus, operating as previously described with reference to FIG. 1, in response to each pixel address signal the image data from the addressed sensor cell along a stepped pixel pattern is coupled, via output port 34, to CPU 12a for processing. As discussed, an analog signal output representative of the illumination incident on each selected sensor element is thus provided so that in this case values of the illumination incident along the length of the oblique line component of the image is provided to the CPU.

In a currently preferred embodiment, operation of the FIG. 4 system is as follows. Start and stop points of an oblique line component of an image portion segment are initially provided based upon data from a bar code locator or other source. It should be noted that while the system will operate equally as well for lines which are not oblique (i.e., horizontal or vertical lines which coincide with rows or columns of sensor cells in an array) the invention is particularly advantageous in its capabilities of addressing oblique line segments and is described in that context.

Figures 5B, 6:
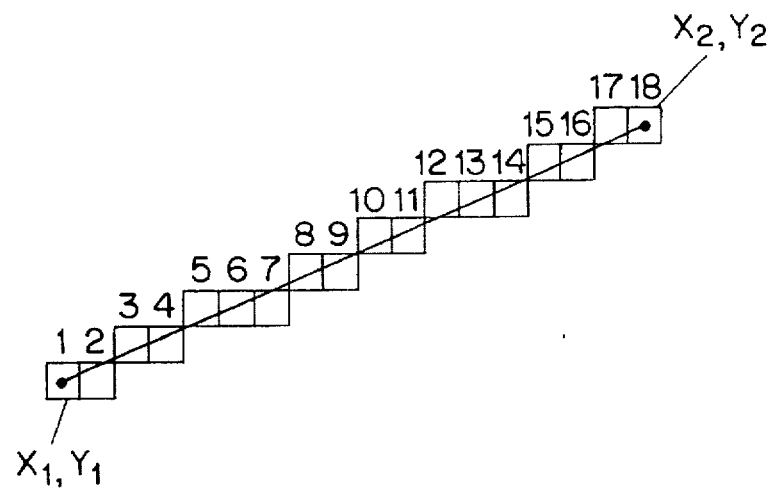
FIG. 6 illustrates a stepped pixel pattern representative of an oblique line component implemented in accordance with the invention.

In the FIG. 4 embodiment, the address unit 20 has the form of a hardware state machine configured using known techniques so as to automatically generate address signals for pixel positions along an oblique line component of stored image data when provided with appropriate line identification data or values. Such a state machine may comprise a semiconductor device configured to carry out the function of outputting the memory addresses or array addresses of image data for a complete pixel pattern in response to location signals representative of end point coordinates and slope of an oblique line component, for example. The choice was made in this embodiment not to send to the address unit 20 cartesian coordinates, in view of what was considered in this case as the unnecessary involvement of cumbersome mathematical relationships in deriving pixel addresses from such coordinates. Instead, mathematical calculations are arranged to be carried out in CPU 12a to provide location signals encompassing the following eight parameters, as representative of the start $(X_1, Y_1)$ and stop $(X_2, Y_2)$ coordinates, for coupling to the address unit:

$X=X_1$
$Y=(Y_1-1)*\text{Total No. of columns in array}$
$n=[X_2-X_1-1]$
$d=2(Y_2-Y_1)-(X_2-X_1)$
Incr $1=2(Y_2-Y_1)$
Incr $2=2(1-m)(Y_2-Y_1)$ where $m=\text{slope}=(X_1-X_2)(Y_1-Y_2)$
Incr $X=1$, if $X_2>X_1$ or $-1$, if $X_2<X_1$ Incr $Y=$ + Total No. of columns, if $Y_2 < Y_1$ or
− Total No. of columns, if $Y_2 > Y_1$ The address unit processes these eight values through the state machine to generate a sequence of pixel address signals as graphically shown in FIGS. 5A and 5B. The address signals can represent cartesian coordinates as shown in FIG. 5A, which is the most typical for the case of the address unit directly accessing the two dimensional sensor array using dashed connection 46 of FIG. 4. In FIG. 5A the outside numbers represent the X and Y cartesian coordinates of the square pixels which contain numbers representing sequential pixel addresses. It will be seen that for this eight pixel wide array the sequential pixel addresses correspond to the cartesian coordinates by the relationship: address=8(Y−1)+X. Alternatively, the address signals can represent sequential numerical addresses as shown in FIG. 5B. This format is most useful in the embodiment where the address unit is coupled to a memory as shown by the solid connection between units 20 and 44 in FIG. 4.

The state machine operates in known manner by conceptually first addressing the $X_1$, $Y_1$ coordinates and then without any further input from the CPU, sequentially addressing each X coordinate and the appropriate Y coordinate (based on the line slope) until it addresses $X_2$, $Y_2$ where it stops. FIG. 6 graphically shows both an example of a stepped pixel pattern for a sample oblique line component and the order in which pixels are addressed for that oblique line component.

Figure 7:
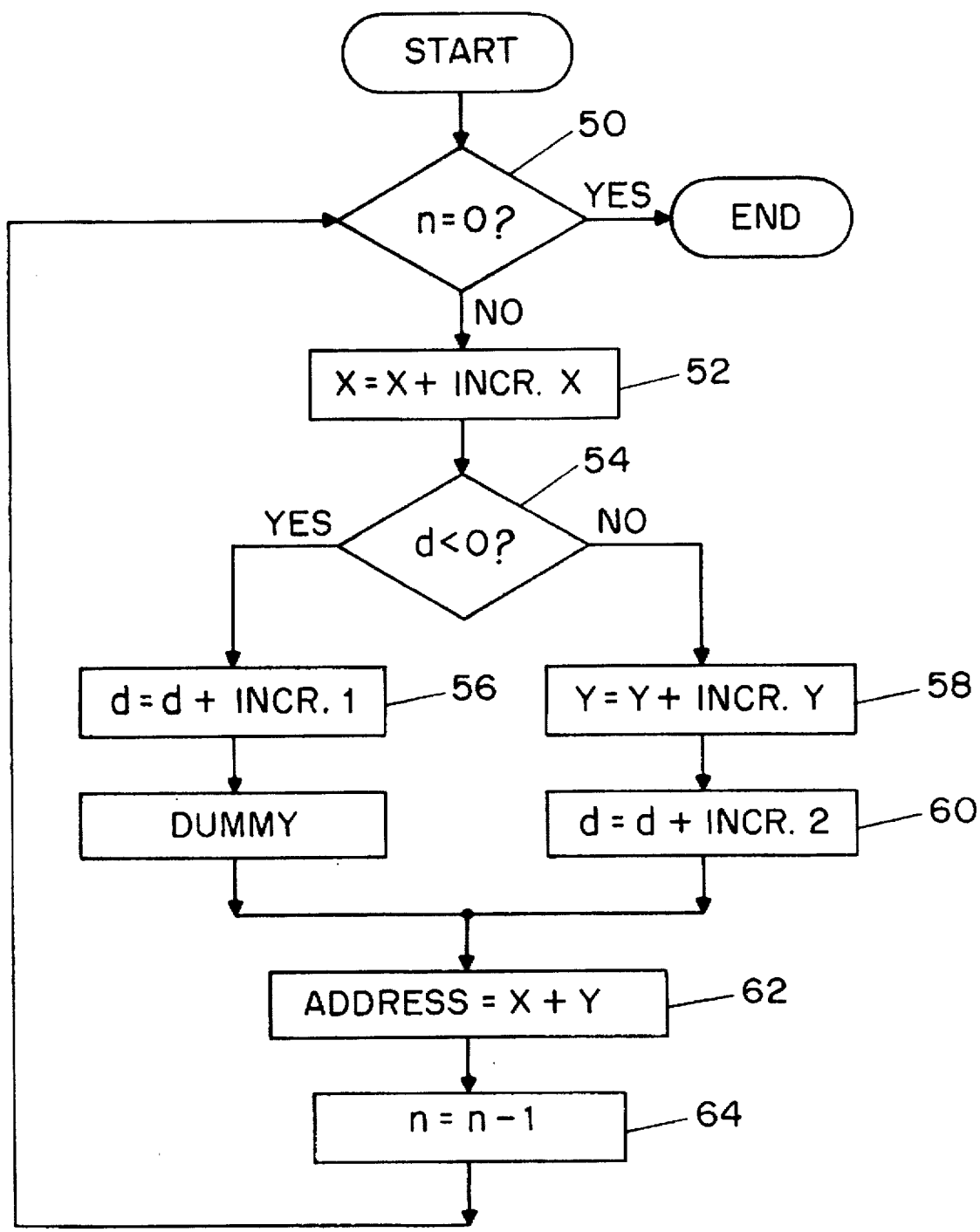
FIG. 7 is a flow chart useful in describing operation of an embodiment of an address unit provided in accordance with the invention.

FIG. 7 is a flow chart representation of operation of the state machine. At step 50 the variable n is a counter that counts the number of cycles necessary to address each pixel on the line. When the counter reaches zero at step 50 all pixels have been addressed and the state machine stops. If n≠0 then, at step 52, X is incremented to the next sequential X value. At step 54 the variable d is a slope counter. With each increment of the value $X_1$ the state machine determines whether the value of Y must also be incremented or stay the same. If the pixels were of infinite resolution, Y would be incremented with each X increment in proportion to the slope of the line. However, as shown in FIG. 6, without infinite resolution, the Y value will not be incremented with each X increment. As described, this state machine does not produce a line in which the Y value is incremented more than once without incrementing the X value. Therefore, in the case where the line has a slope greater than 45 degrees, the X and Y coordinates are simply reversed for processing. If d is less than zero at step 54, the Y value is not incremented, but d is updated for the next cycle at step 56. If d is not less than zero, then Y is incremented at step 58 and d is updated for the next cycle at step 60. After incrementing X and, if appropriate, incrementing Y, the address is X+Y which is sent to the sensor array 16 at step 62. At step 64 the cycle counter n is updated.

Figure 8:
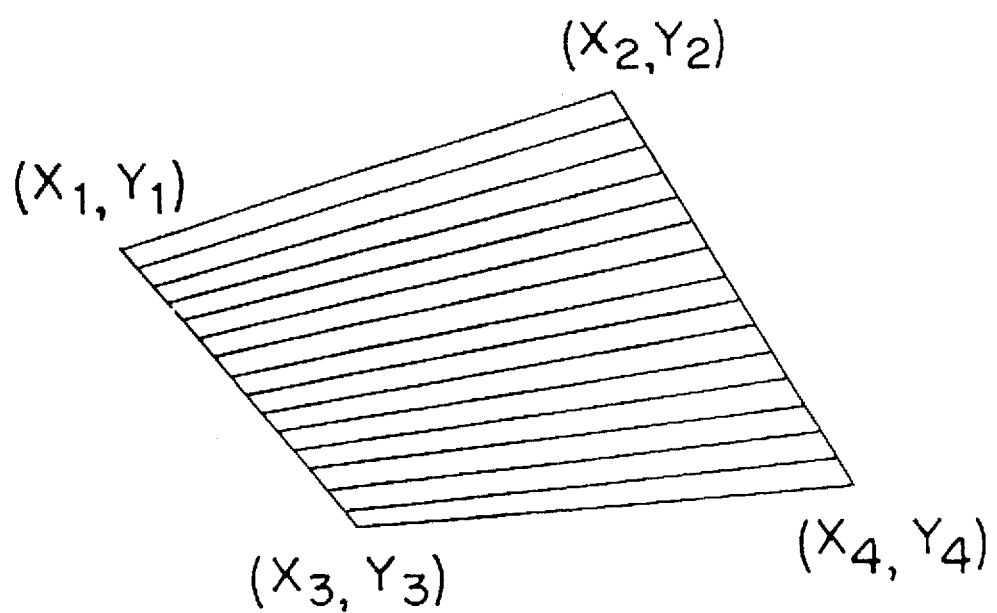
FIG. 8 is a graphic representation of a selected image area portion, which may contain a bar code, with corner location coordinates and traversed by a plurality of oblique line components pursuant to the invention.

Utilizing information as provided on the basis of operation pursuant to the Locating 2-D Bar Codes U.S. Pat. No. 5,304,787, for example, the four corner locations of a dataform in the image area may be determined. A representation of four such corner locations is provided in FIG. 8. As shown, depending upon the characteristics of the surface upon which a dataform exists and the aspect angle of the sensor element array relative to such surface when the image is captured, the area may not be rectangular. Using this corner information, the CPU using its run line programming as previously referred to identifies a plurality of laterally spaced oblique line components. These oblique line components are shown as the plurality of laterally spaced lines within the four corner locations in FIG. 8, however, each will typically not be a "line" per se, but will be an oblique line component of the image as represented by the 18 numbered pixel positions of FIG. 6, for example. As shown in FIG. 8, the resulting oblique line components need not be parallel to each other, but most generally will be oblique to the rows and columns of sensor cells. With reference to FIGS. 6 and 8, it will be appreciated that the stepped pixel patterns (one of which is shown in FIG. 6) will typically be successively laterally spaced: (a) far enough from each other (resulting from the spaced positions of the oblique line components in FIG. 8) so that there will be intermediate pixel locations not included in adjacent stepped pixel patterns; and (b) close enough to each other so that each element of said dataform will be traversed by at least one stepped pixel pattern as discussed with reference to FIG. 8. As an alternative to identification of each oblique line component by the CPU, the address unit may be arranged to provide address signals to identify stepped pixel patterns for a complete set of parallel oblique line components in response to a single slope or slope/end point input from the CPU.

Figure 9:
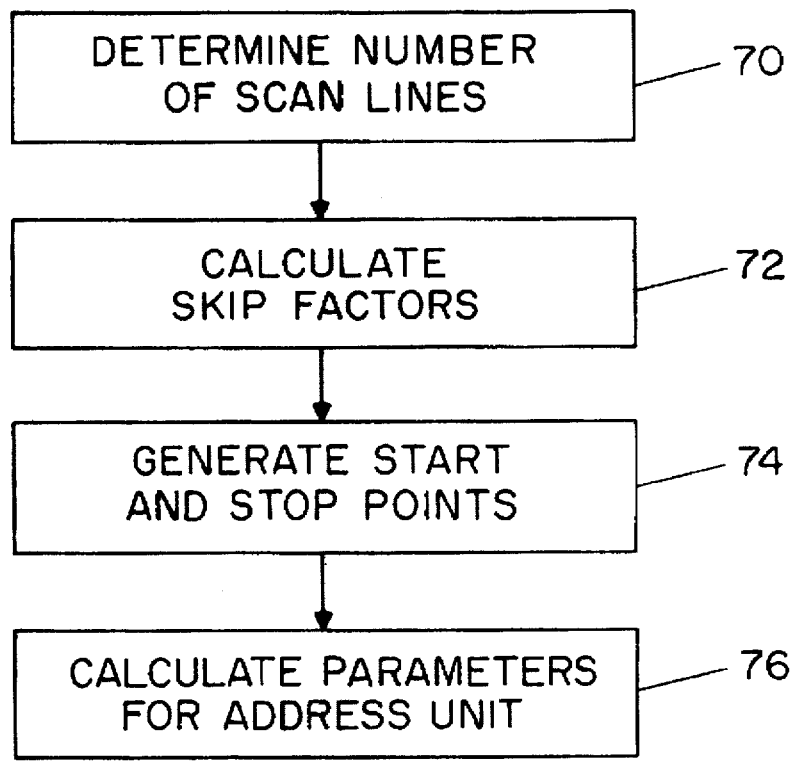
FIG. 9 is a flow chart useful in describing the determination of the number of oblique line components appropriate for the image area portion of FIG. 8.

FIG. 9 is a flow chart that briefly illustrates the operation of the run line programming for stop points for a plurality of lines within the area of interest as shown in FIG. 8. At step 70, the run line program is used to determine the quantity of lines necessary. This determination can be based on an estimate of the resolution of the dataform utilizing data obtained while locating the bar code. The FIG. 8 example shows 16 scan lines. At step 72, the system calculates four skip factors as follows:

$X \text{ Left Skip} = (X_3 - X_1)/(\text{Lines}-1)$ $X \text{ Right Skip} = (X_4 - X_2)/(\text{Lines}-1)$ $Y \text{ Left Skip} = (Y_3 - Y_1)/(\text{Lines}-1)$ $Y \text{ Right Skip} = (Y_4 - Y_2)/(\text{Lines}-1)$ At step 74 the system generates each start point (Xsi, Ysi) and each end point (Xei, Yei) as per the following formulas:

$Xsi = X_1 + (i-1)*X \text{ Left Skip}$ $Ysi = Y_1 + (i-1)*Y \text{ Left Skip}$ $Xei = X_2 + (i-1)*X \text{ Right Skip}$ $Yei = Y_2 + (i-1)*Y \text{ Right Skip}$ (all values rounded to integers)

The eight parameters needed by the state machine to read out the pixels forming the oblique line component are then calculated at 76.

Figure 10:
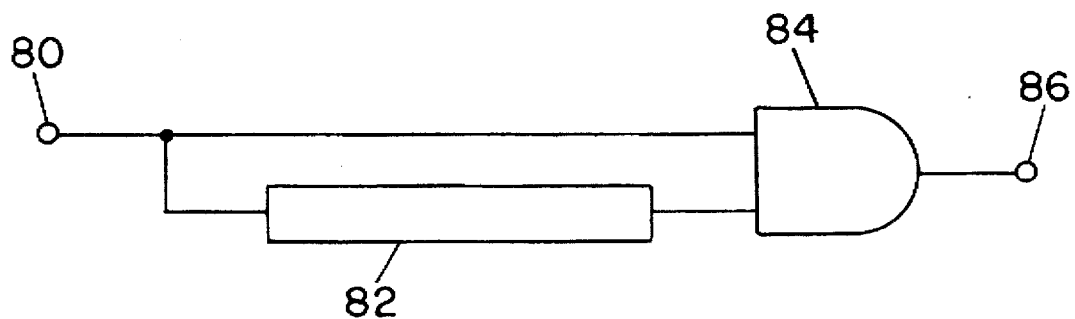
FIG. 10 illustrates a circuit usable to convert an analog image data signal to a square wave signal.

In the embodiment in which the sensor array 16 is directly accessed by the addressed unit 20 (via dashed connection 46) the output signal of the sensor array is an analog voltage signal sequentially representative of the intensity of illumination incident on each addressed pixel. The circuit of FIG. 10 can be used to convert the signal to a square wave formed by dynamically thresholding the signal, thereby determining whether the pixel represents binary black or white. Briefly, an analog signal input at 80 has direct and low pass filter 82 versions compared in comparator 84 to provide a binary square wave signal at 86. The square wave is then input to a counter which outputs count values proportionate to the length of each peak and trough of the square wave. The count values, which are representative of element width and spacing, are returned to the CPU for decoding of the bar code.

In the embodiment utilizing the frame store 44 to make available an entire frame in memory, each memory address will typically contain an 8-bit value representative of the level of illumination incident on the pixel corresponding to the address. When the address unit 20 selects data from the memory, each 8-bit value can be converted to an analog signal by a D/A converter to reproduce an analog wave equivalent to the analog wave of the first embodiment. This reproduced wave can then be input into the FIG. 10 circuit to provide a square wave usable as described for decoding of the bar code.

In operation of the system as described, a method of oblique access to image data for an oblique line component of an image portion containing an image of a dataform (e.g., portion 39 of FIG. 2), includes the following steps:
(a) providing image data representative of rows and columns of pixels comprising an image area including the image portion containing the dataform image;
(b) providing address signals identifying a stepped pixel pattern (such as shown in FIG. 6) representative of a first oblique line component (e.g., one of 16 shown in FIG. 8) of the image portion, the oblique line component positioned obliquely to such rows and columns;
(c) utilizing the address signals to make available for further use output signals representative of image data for pixels included in the stepped pixel pattern (per FIG. 6) and thereby make available output signals representative of the first oblique line component (per FIG. 8) of the selected image portion containing the dataform image;
(d) utilizing such output signals to decode the dataform.

For reading a two-dimensional bar code, for example, steps (b) and (c) are repeated for additional stepped pixel patterns representative of additional oblique line components such as shown in FIG. 8. Preferably successive oblique line patterns are laterally spaced as shown in FIG. 8 by a spacing greater than the pixel to pixel pitch in a direction transverse to the oblique line components. Step (a) may also include storing pixel values in memory for access in step (c).

Consistent with the discussion above, in step (b) address signals are desirably provided to identify a stepped pixel pattern representative of a first oblique line component which is positioned so as to traverse a plurality of elements comprising all or at least a major portion of a row of elements of said dataform. With the dataform positioned in an oblique alignment the oblique line component may thus be positioned perpendicular to the height of bar elements of a bar code so that the image data representative of such oblique line component includes bar element width and spacing information for a full line of bar code elements. Even if such perpendicular alignment is not achieved, significant improvement can be provided in readout and processing of image data to enable dataform decoding.

It will thus be appreciated that oblique access to image data in accordance with the invention may utilize array address signals for random access directly to image data developed in an array of sensor cells, or may utilize memory address signals for random access to image data originating in such array which has been read out and stored in a memory device, such as a frame store. Further, once an oblique line component of an image has been identified, an address unit effective to provide such address signals (identifying a stepped pixel pattern corresponding to the oblique line component) can be implemented as a software unit supported by the CPU or in a hardware context as a state machine unit to provide the address signals as described.

In addition, any of the four thus described configuration combinations (software address unit/sensor array, hardware state machine unit/sensor array, software address unit/ memory unit and hardware state machine unit/memory unit) can be arranged to provide output signals in the form of either a grayscale pixel value wave or a binary square wave. With output signals read out of the array a grayscale pixel value wave is provided and, if desired, can be converted to a binary square wave by use of the FIG. 10 dynamic thresholding circuit. With output signals read out of memory a digital signal from the memory can be converted to a grayscale pixel value wave by use of a digital to analog converter and, if desired, further converted to a binary square wave by use of the FIG. 10 dynamic thresholding circuit or other suitable device.

While there have been described the currently preferred embodiments of the invention, those skilled in the art will recognize that other and further modifications may be made without departing from the invention and it is intended to claim all modifications and variations as fall within the scope of the invention.

What is claimed is:

1. An oblique access system, enabling access to dataform image data via an oblique line component of an image portion containing an image of said dataform, comprising:

a two-dimensional array of image sensor cells positioned in rows and columns and arranged to provide image data representative of an image area including said image portion containing said dataform image;

an address unit arranged to provide address signals effective to identify a stepped pixel pattern of sensor cells representative of said oblique line component, said oblique line component positioned obliquely to said rows and columns and said address signals usable to access image data originating from sensor cells comprising said pattern; and a data access arrangement responsive to said address signals to select image data from sensor cells positioned in said stepped pixel pattern, said image data comprising signals thereby representative of said oblique line component of the image portion containing said dataform image.

2. An oblique access system as in claim 1, wherein said data access arrangement provides said output signals as a one-dimensional sequence of image data values without related information to identify the two-dimensional oblique orientation of said oblique line component, whereby said output signals effectively represent said oblique line component after rotation to an alignment not oblique to said rows and columns.

3. An oblique access system as in claim 1, additionally comprising a central processing unit coupled to said address unit and arranged to provide location signals representative of at least one of end point coordinate information and slope information representative of said oblique line component for use by said address unit, and coupled to said data access arrangement and arranged to receive said output signals for use in decoding said dataform.

4. An oblique access system as in claim 1, wherein said address unit is arranged to successively provide address signals for stepped pixel patterns representative of a plurality of oblique line components, and said data access arrangement is configured to successively make available output signals representative of said plurality of oblique line components.

5. An oblique access system as in claim 4, wherein said plurality of oblique line components are successively laterally spaced far enough from each other so that there are intermediate pixel locations not included in adjacent stepped pixel patterns, and close enough to each other so that each element of said dataform is traversed by at least one stepped pixel pattern.

6. An oblique access system as in claim 5, additionally comprising a central processing unit coupled to said data access arrangement and arranged to receive said output signals for use in decoding said dataform.

7. An oblique access system as in claim 1, wherein said data access arrangement comprises:

at least one readout circuit coupled to said array and providing random access responsive to said address signals to selectively designate row and column intersections representative of locations of individual sensor cells of said stepped pixel pattern; and at least one sampling device coupled to said array and arranged to access image data available at said sensor cells at said row and column intersections to provide said output signals representative of said oblique line component of the image portion containing said dataform.

8. An oblique access system, enabling access to dataform image data via an oblique line component of an image portion containing an image of said dataform, comprising:

a two-dimensional array of image sensor cells positioned in rows and columns and arranged to provide image data representative of an image area including said image portion containing said dataform image;

a memory unit coupled to said array to store at memory locations image data representative of said image area and responsive to memory address signals to make available for further use output signals representative of image data at memory locations identified by said memory address signals;

an address unit coupled to said memory unit and arranged to provide memory address signals effective to identify the memory locations of stored image data originating from sensor cells comprising a stepped pixel pattern extending between two end points within said image area and representative of said oblique line component, said oblique line component positioned obliquely to said rows and columns and said memory address signals coupled to said memory unit to access stored image data to provide output signals representative of said oblique line component of the image portion containing said dataform; and a central processing unit coupled to said address unit to provide location signals representative of the location within said image area of said end points for said oblique line component.

9. An oblique access system as in claim 8, wherein said central processing unit is additionally coupled to said memory unit and arranged to receive said output signals for use in decoding said dataform.

10. An oblique access system as in claim 8, wherein said address unit is a hardware state unit including a semiconductor device configured to provide said memory address signals in response to said location signals from said central processing unit.

11. An oblique access system as in claim 8, wherein said output signals from said memory unit are provided in the form of one of: (a) a grayscale pixel value wave by inclusion in the system of a digital to analog converter; and (b) a binary square wave by inclusion in the system of a digital to analog converter followed by a binary thresholding circuit.

12. An oblique access system as in claim 8, wherein said address unit is arranged to successively provide address signals for stepped pixel patterns representative of a plurality of laterally spaced oblique line components, and said memory unit is responsive to said address signals to make available output signals representative of said plurality of oblique line components.

13. An oblique access system as in claim 12, wherein said plurality of oblique line components are successively laterally spaced far enough from each other so that there are intermediate pixel locations not included in adjacent stepped pixel patterns, and close enough to each other so that each element of said dataform is traversed by at least one stepped pixel pattern.

14. An oblique access system enabling access to dataform image data via an oblique line component of an image portion containing an image of said dataform, comprising:

a two-dimensional array of image sensor cells positioned in rows and columns and arranged to provide image data representative of an image area including said image portion containing said dataform image;

an address unit arranged to provide array address signals effective to identify a stepped pixel pattern of sensor cells representative of said oblique line component, said oblique line component positioned obliquely to said rows and columns and said array address signals usable to identify row and column locations of said sensor cells comprising said pattern;

at least one readout circuit coupled to said array and providing random access responsive to said array address signals to selectively designate row and column intersections representative of locations of individual sensor cells of said stepped pixel pattern of sensor cells;

at least one sampling device coupled to said array and arranged to access image data available at said sensor cells at said row and column intersections; and an output device coupled to each said sampling device and arranged to provide originating image data originating from sensor cells comprising said stepped pixel pattern, said output image data comprising signals thereby representative of said oblique line component of the image portion containing said dataform image.

15. An oblique access system as in claim 14, additionally comprising a central processing unit coupled to said address unit to provide location signals representative of at least one of: the end point coordinates of said oblique line component and the slope of said oblique line component.

16. An oblique access system as in claim 15, wherein said central processing unit is additionally coupled to said output device and arranged to receive said output signals for use in decoding said dataform.

17. An oblique access system as in claim 15, wherein said address unit is one of: (a) a hardware state unit including a semiconductor device configured to provide said array address signals in response to said location signals from said central processing unit; and (b) a software unit supported by said central processing unit and configured to provide said array address signals in response to said location signals.

18. An oblique access system as in claim 15, wherein said output signals from said output device are provided in the form of: (a) a grayscale pixel value wave representative of signals read out of said sensor cells; and (b) a binary wave by inclusion in the system of a binary thresholding circuit.

19. An oblique access system as in claim 14, wherein said address unit is arranged to successively provide address signals for stepped pixel patterns representative of a plurality of laterally spaced oblique line components, and said output device provides output signals representative of said plurality of oblique line components.

20. An oblique access system as in claim 19, wherein said plurality of oblique line components are successively laterally spaced far enough from each other so that there are intermediate pixel locations not included in adjacent stepped pixel patterns, and close enough to each other so that each element of said dataform is traversed by at least one stepped pixel pattern.

21. An oblique access system as in claim 20, additionally comprising a central processing unit coupled to said output device and arranged to receive said output signals for use in decoding said dataform.

22. An oblique access method, for accessing image data representative of a dataform, comprising the steps of:

(a) providing a two-dimensional array of image sensor cells arranged in rows and columns to provide image data representative of an image area including an image portion containing an image of said dataform;

(b) providing location signals representative of the end point coordinates of a first oblique line component extending between two end points within said image area obliquely to said rows and columns;

(c) utilizing said location signals to provide address signals identifying a stepped pixel pattern extending between said two end points and representative of said first oblique line component; and (d) utilizing said address signals to couple from sensor cells image data for pixels included in said stepped pixel pattern, said image data thereby representative of said first oblique line component.

23. An oblique access method as in claim 22 additionally comprising the step of:

(e) utilizing said output signals to decode said dataform.

24. An oblique access method as in claim 22, wherein in step (c) said address signals are provided to identify a stepped pixel pattern representative of a first oblique line component which is positioned so as to traverse a plurality of elements comprising at least a portion of a row of elements of said dataform, said dataform being positioned in an oblique alignment in said selected image area portion.

25. An oblique access method as in claim 24 additionally comprising the step of:

(e) utilizing said output signals to decode said dataform.

26. An oblique access method as in claim 22, wherein steps (b), (c) and (d) are repeated for additional stepped pixel patterns representative of additional oblique line components successively laterally spaced from said first oblique line pattern by a spacing greater than the pixel to pixel pitch transverse to said oblique line components.

* * * * *